(12) United States Patent
Maemura

(10) Patent No.: US 7,053,442 B2
(45) Date of Patent: *May 30, 2006

(54) NONVOLATILE SEMICONDUCTOR MEMORY DEVICE

(75) Inventor: Kimihiro Maemura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 125 days.

This patent is subject to a terminal disclaimer.

(21) Appl. No.: 10/782,975

(22) Filed: Feb. 23, 2004

(65) Prior Publication Data

US 2004/0232474 A1    Nov. 25, 2004

(30) Foreign Application Priority Data

Feb. 28, 2003   (JP) .............................. 2003-054448

(51) Int. Cl.
    *H01L 29/788*    (2006.01)
(52) U.S. Cl. .................. 257/315; 438/200; 438/257; 438/258; 438/259; 438/260; 438/267; 365/185.02; 365/185.18; 365/185.27; 365/185.28; 365/185.29
(58) Field of Classification Search ................ 438/200, 438/257, 258, 259, 260, 267, 287; 365/185.02, 365/185.18, 185.27, 185.28, 185.29
    See application file for complete search history.

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,587,380 B1 | 7/2003 | Kanai et al. | |
| 6,587,381 B1 | 7/2003 | Kanai et al. | |
| 6,646,916 B1 | 11/2003 | Kamei | |
| 6,650,591 B1 | 11/2003 | Owa | |
| 6,654,282 B1 | 11/2003 | Kanai | |
| 6,697,280 B1 | 2/2004 | Natori | |
| 6,704,224 B1 | 3/2004 | Natori | |
| 6,707,695 B1 | 3/2004 | Owa | |
| 6,707,716 B1 | 3/2004 | Natori | |

(Continued)

FOREIGN PATENT DOCUMENTS

JP       A 6-181319       6/1994

(Continued)

OTHER PUBLICATIONS

U.S. Appl. No. 10/728,746, filed Dec. 8, 2003, Natori.

(Continued)

*Primary Examiner*—Mai-Huong Tran
(74) *Attorney, Agent, or Firm*—Oliff & Berridge, PLC

(57) ABSTRACT

A nonvolatile semiconductor memory device having a small layout area includes a memory cell array in which a plurality of memory cells are arranged in a row direction and a column direction. The memory cell array includes source line diffusion layers, each of the source line diffusion layers extending along the row direction and connecting in common with the memory cells arranged in the row direction, bitline diffusion layers, element isolation regions which separate each of the bitline diffusion layers, and word gate common connection sections. Each of the memory cells includes a word gate and a select gate. One of the bitline diffusion layers is formed between two word gates adjacent in the column direction Y. Each of the word gate common connection sections is connected with the two word gates above one of the element isolation regions.

5 Claims, 13 Drawing Sheets

U.S. PATENT DOCUMENTS

| | | | |
|---|---|---|---|
| 6,707,720 B1 | 3/2004 | Kamei et al. | |
| 6,707,742 B1 | 3/2004 | Kamei | |
| 6,710,399 B1 | 3/2004 | Kamei | |
| 6,717,854 B1 | 4/2004 | Natori | |
| 6,738,291 B1 | 5/2004 | Kamei | |
| 6,744,106 B1 | 6/2004 | Kanai | |
| 6,757,197 B1 | 6/2004 | Kamei | |
| 6,759,290 B1 * | 7/2004 | Ogura et al. | 438/200 |
| 6,760,253 B1 | 7/2004 | Kamei | |
| 6,762,960 B1 | 7/2004 | Natori | |
| 2002/0191453 A1 | 12/2002 | Owa | |
| 2003/0025149 A1 | 2/2003 | Kanai | |
| 2003/0025150 A1 | 2/2003 | Kanai et al. | |
| 2003/0027411 A1 | 2/2003 | Kanai | |
| 2003/0072191 A1 | 4/2003 | Kamei | |
| 2003/0072194 A1 | 4/2003 | Kamei | |
| 2003/0095443 A1 | 5/2003 | Natori | |
| 2003/0151070 A1 | 8/2003 | Natori | |
| 2003/0164517 A1 | 9/2003 | Kamei | |
| 2003/0174558 A1 | 9/2003 | Kamei | |
| 2003/0179609 A1 | 9/2003 | Natori | |
| 2003/0198102 A1 | 10/2003 | Kamei | |
| 2003/0198103 A1 | 10/2003 | Kamei | |
| 2004/0013018 A1 | 1/2004 | Kanai | |
| 2004/0013027 A1 | 1/2004 | Kanai | |
| 2004/0061139 A1 | 4/2004 | Natori | |
| 2004/0229407 A1 * | 11/2004 | Owa | |

FOREIGN PATENT DOCUMENTS

| | | |
|---|---|---|
| JP | A 7-161851 | 6/1995 |
| JP | A 11-74389 | 3/1999 |
| JP | B1 2978477 | 9/1999 |
| JP | A 2001-156188 | 6/2001 |
| JP | 2003-100917 | 4/2003 |

OTHER PUBLICATIONS

U.S. Appl. No. 10/733,455, filed Dec. 12, 2003, Kanai.
U.S. Appl. No. 10/779,683, filed Feb. 18, 2004, Kanai.
U.S. Appl. No. 10/782,950, filed Feb. 23, 2004, Owa.
U.S. Appl. No. 10/783,019, filed Feb. 23, 2004 Maemura.
U.S. Appl. No. 10/782,974, filed Feb. 23, 2004, Owa.
Hayashi et al., "Twin MONOS Cell with Dual Control Gates," Symposium on VLSI Technology Digest of Technical Papers, 2000.
Chang et al., "A New SONOS Memory Using Source-Side Injection for Programming," IEEE Electron Device Letters, vol. 19, No. 7, pp. 253-255, Jul. 1998.
Chen et al., "A Novel Flash Memory Device with S Plit Gate Source Side Injection and ONO Charge Storage Stack (SPIN)," Symposium on VLSI Technology Digest of Technical Papers, pp. 63-64.

* cited by examiner

NONVOLATILE SEMICONDUCTOR MEMORY DEVICE

Japanese Patent Application No. 2003-54448, filed on Feb. 28, 2003, is hereby incorporated by reference in its entirety.

BACKGROUND OF THE INVENTION

The present invention relates to a nonvolatile semiconductor memory device including a nonvolatile memory element controlled by a word gate and a select gate.

As an example of a nonvolatile semiconductor memory device, a MONOS (Metal-Oxide-Nitride-Oxide-Semiconductor or -Substrate) nonvolatile semiconductor memory device is known. In the MONOS nonvolatile semiconductor memory device, a gate insulating film between a channel and a gate is formed of a laminate consisting of a silicon oxide film, a silicon nitride film, and a silicon oxide film, and a charge is trapped in the silicon nitride film.

As the MONOS nonvolatile semiconductor memory device, a MONOS flash memory cell including a nonvolatile memory element (MONOS memory element) controlled by one select gate and one control gate is disclosed (see Japanese Patent Application Laid-open No. 6-181319, Japanese Patent Application Laid-open No. 11-74389, U.S. Pat. No. 5,408,115, and U.S. Pat. No. 5,969,383, for example).

BRIEF SUMMARY OF THE INVENTION

The present invention may provide a nonvolatile semiconductor memory device having a small layout area.

The nonvolatile semiconductor memory device according to the present invention includes:

a memory cell array in which a plurality of memory cells are arranged in a row direction and a column direction, wherein the memory cell array includes:

a plurality of source line diffusion layers, each of the source line diffusion layers extending along the row direction and connecting in common with the memory cells arranged in the row direction, a plurality of bitline diffusion layers, a plurality of element isolation regions which separate each of the bitline diffusion layers, and a plurality of word gate common connection sections, wherein each of the memory cells includes one of the source line diffusion layers, one of the bitline diffusion layers, a channel region between the one source line diffusion layer and the one bitline diffusion layer, a word gate and a select gate which are disposed to face the channel region, and a nonvolatile memory element formed between the word gate and the channel region, wherein two of the word gates are formed between two of the select gates adjacent in the column direction, and one of the bitline diffusion layers is formed between the two word gates, wherein each of the word gate common connection sections is connected in common with the two word gates above at least one of the element isolation regions, and wherein a plurality of word gate wiring layers are formed above the word gate common connection sections, and each of the word gate wiring layers is connected with at least one word gate interconnection which is connected with one of the word gate common connection sections.

This enables the two word gates to be connected without separating each of the source line diffusion layers.

An insulator may be formed under the two word gates, and each of the word gate common connection sections may include a conductor which is connected in common with the two word gates formed on the insulator.

The insulator may be formed by continuously forming the same material as a material for the nonvolatile memory element.

This enables the insulator to be formed without increasing the number of process steps.

The word gate common connection sections may be formed along the column direction.

This prevents the address control method of the memory device from becoming complicated.

This nonvolatile semiconductor memory device may further include a bitline connection section which is provided between one of the word gate common connection sections and one of the element isolation regions adjacent to the one word gate common connection section in the row direction, and connects one of the bitline diffusion layers with one of a plurality of bitlines.

This enables a memory cell array to be formed in which the memory cells are efficiently disposed.

DETAILED DESCRIPTION OF THE EMBODIMENT

An embodiment of the present invention is described below with reference to the drawings.

1. Entire Configuration and Memory Block

Figure 1:
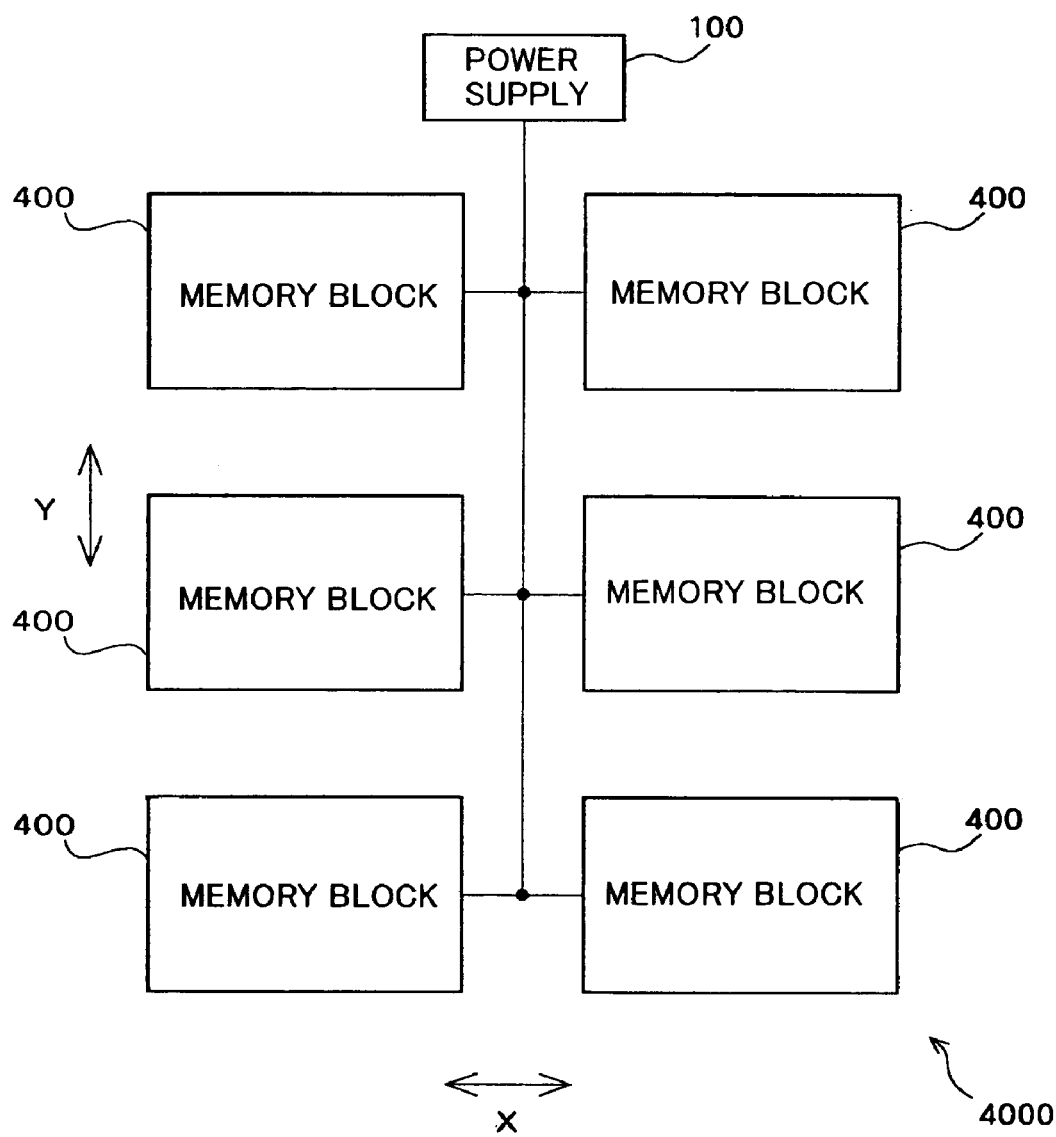
FIG. 1 is an overall diagram according to an embodiment of the present invention.

FIG. 1 is a block diagram showing the entire configuration of the present embodiment. A memory cell array 4000 includes a plurality of memory cells 410 (illustrated later) arranged along a row direction X and a column direction Y. The memory cell array 4000 includes a plurality of memory blocks 400. The memory block 400 is made up of the memory cells 410 (illustrated later). A plurality of types of voltages are generated from a power supply circuit 100. The voltages generated from the power supply circuit 100 are supplied to the memory blocks 400 through a plurality of voltage supply lines. The memory cell array 4000 includes a bitline driver section (not shown) which drives bitlines 60 (illustrated later) in the memory cell array 4000.

Figure 2:
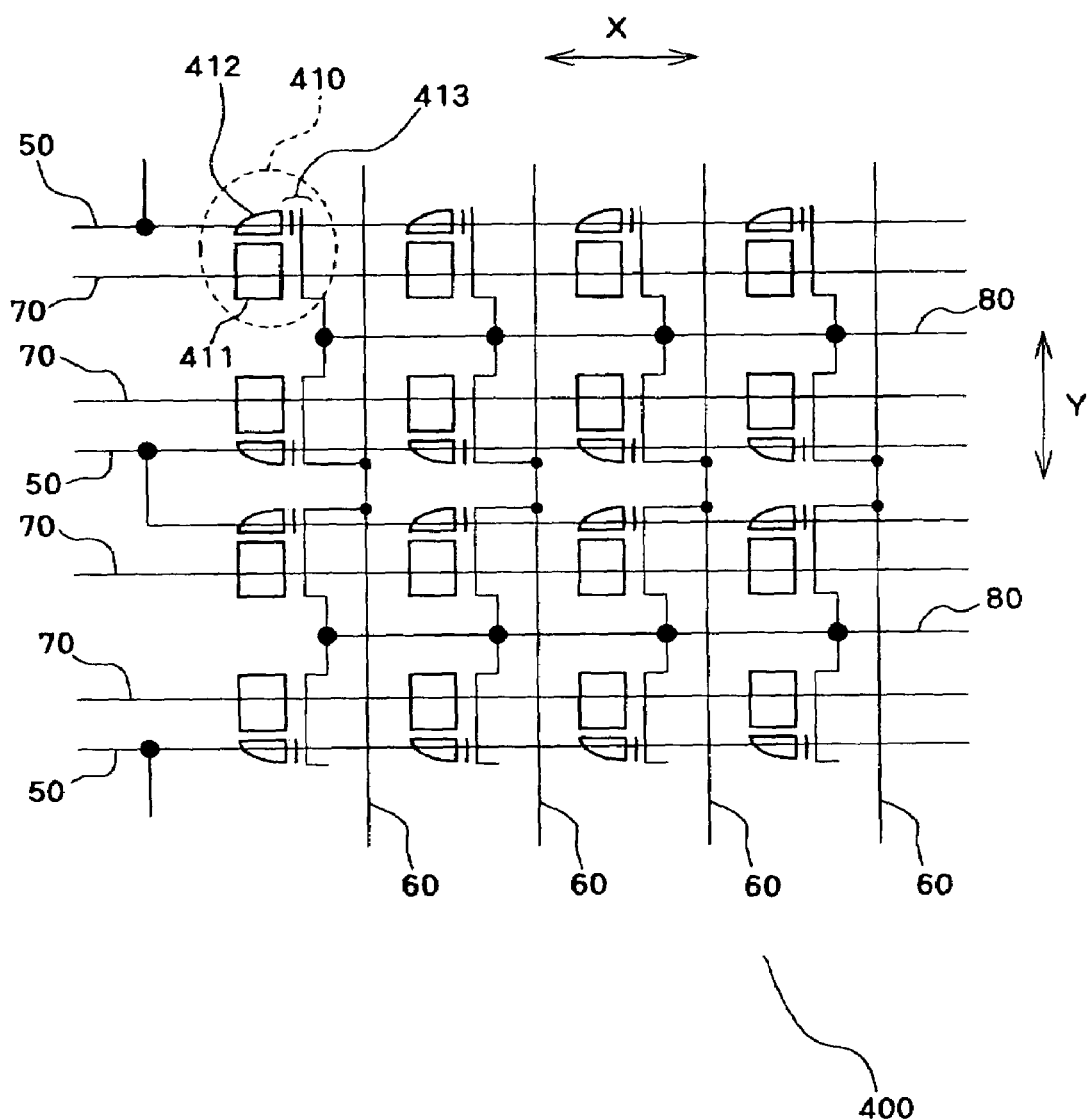
FIG. 2 is an equivalent circuit diagram showing a part of a memory block according to an embodiment of the present invention.

FIG. 2 is a circuit diagram showing a part of the memory block 400. The memory block 400 includes a plurality of wordlines 50, a plurality of bitlines 60, a plurality of select lines 70, a plurality of source lines 80, and a plurality of memory cells 410. The memory block 400 also includes a wordline driver section, a select line driver section, and a source line driver section (not shown). In FIG. 2, the area encircled by a dotted line indicates one memory cell 410.

The memory cell 410 includes a select gate 411, a word gate 412, and an ONO film 413. The structure of the memory cell 410 is described later in detail.

The wordline driver section (not shown) drives all the wordlines 50 in the memory block 400. The wordline 50 connects in common the word gates 412 of the memory cells 410 disposed in the memory block 400 along the row direction X.

The select line driver section (not shown) drives all the select lines 70 in the memory block 400. The select line 70 connects in common the select gates 411 of the memory cells 410 disposed in the memory block 400 along the row direction X.

The source line driver section (not shown) drives all the source lines 80 in the memory block 400. The source line 80 connects in common source line diffusion layers SLD (illustrated later) of the memory cells 410 disposed in the memory block 400 along the row direction X.

The bitline driver section (not shown) drives all the bitlines 60 in the memory block 400. The bitline 60 connects in common bitline diffusion layers BLD (illustrated later) of the memory cells 410 in the column direction Y.

Figure 3:
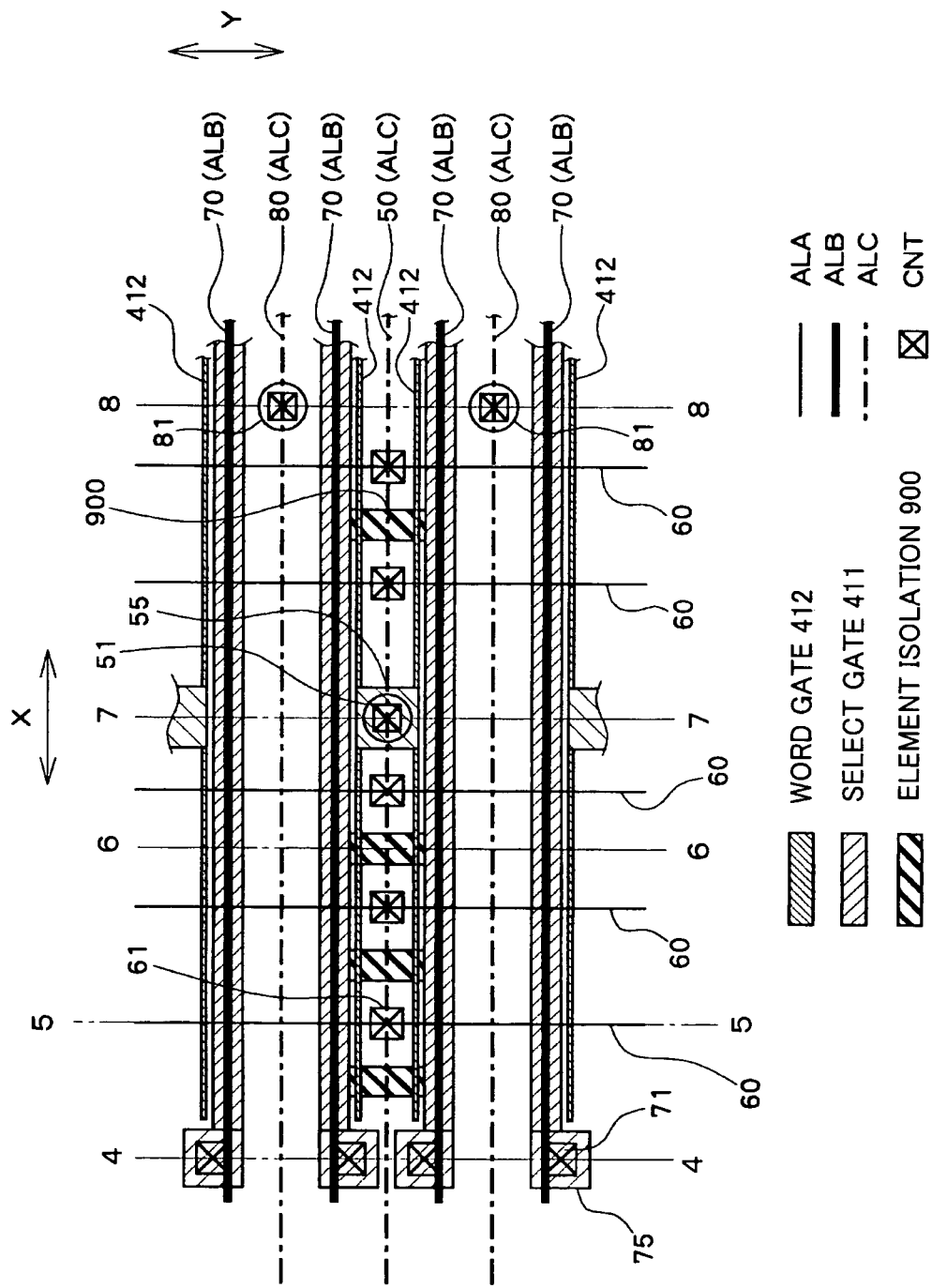
FIG. 3 is a plan view showing a structure of a part of a memory block according to an embodiment of the present invention.

FIG. 3 is a plan view schematically showing the connection relationship and the positional relationship between each layer in a part of the memory block 400. A numeral 900 indicates an element isolation region (shallow trench isolation (STI), for example), and a symbol CONT indicates a contact. A numeral 55 indicates a word gate common connection section. A symbol ALA indicates a first interconnect layer, a symbol ALB indicates a second interconnect layer, and a symbol ALC indicates a third interconnect layer. The first interconnect layer among the interconnect layers ALA to ALC is the interconnect layer closest to the substrate.

The wordlines 50 are formed as the third interconnect layer ALC along the row direction X. The wordline 50 may be formed of a metal, for example. The word gates 412 are formed on the substrate 414 through an insulating film (silicon oxide film, for example) so as to extend along the row direction X. The word gate 412 is formed of a conductor (polysilicon, for example). The word gate common connection section 55 (illustrated later in detail) connects in common two word gates 412 among the plurality of word gates 412. Each of the wordlines 50 is connected with the word gate common connection sections 55 through word gate interconnections 51 (see FIG. 7).

The source lines 80 are formed as the third interconnect layer ALC along the row direction X. The source line 80 may be formed of a metal, for example. The source line diffusion layer SLD is formed in the surface layer of the substrate 414 so as to extend along the row direction X. The source line diffusion layer SLD is formed by ion implantation into the surface of the substrate 414, for example. Each of the source lines 80 is connected with the source line diffusion layers SLD in the substrate 414 through source line connection sections 81.

The select lines 70 are formed as the second interconnect layer ALB along the row direction X. The select line 70 may be formed of a metal, for example. The select gate 411 is formed on the substrate 414 through an insulating film (silicon oxide film, for example) so as to extend along the row direction X. The select gate 411 is formed of a conductor (polysilicon), for example. A plurality of select gate connection sections 75 (illustrated later in detail) are formed for the select line 70. Each of the select lines 70 is connected with the select gate connection sections 75 through the select line connection sections 71.

The bitlines 60 are formed as the first interconnect layer ALA along the column direction Y. The bitline 60 may be formed of a metal, for example. The bitline diffusion layer BLD is formed in the surface layer of the substrate 414 so as to extend along the row direction X. The bitline diffusion layer BLD is formed by ion implantation into the surface of the substrate 414, for example. The element isolation regions 900 are formed in the bitline diffusion layer BLD. This allows the bitline diffusion layer BLD to be divided into a plurality of electrically insulated regions. A bitline connection section 61 is formed in each of the divided regions of the bitline diffusion layer BLD. Each of the bitlines 60 is connected with the bitline diffusion layers BLD in the substrate 414 through the bitline connection sections 61.

FIGS. 4 to 8 are cross-sectional views respectively showing the structure taken along line 4—4, line 5—5, line 6—6, line 7—7, and line 8—8 shown in FIG. 3. The widthwise direction in FIGS. 4 to 8 is the column direction Y.

Figure 4:
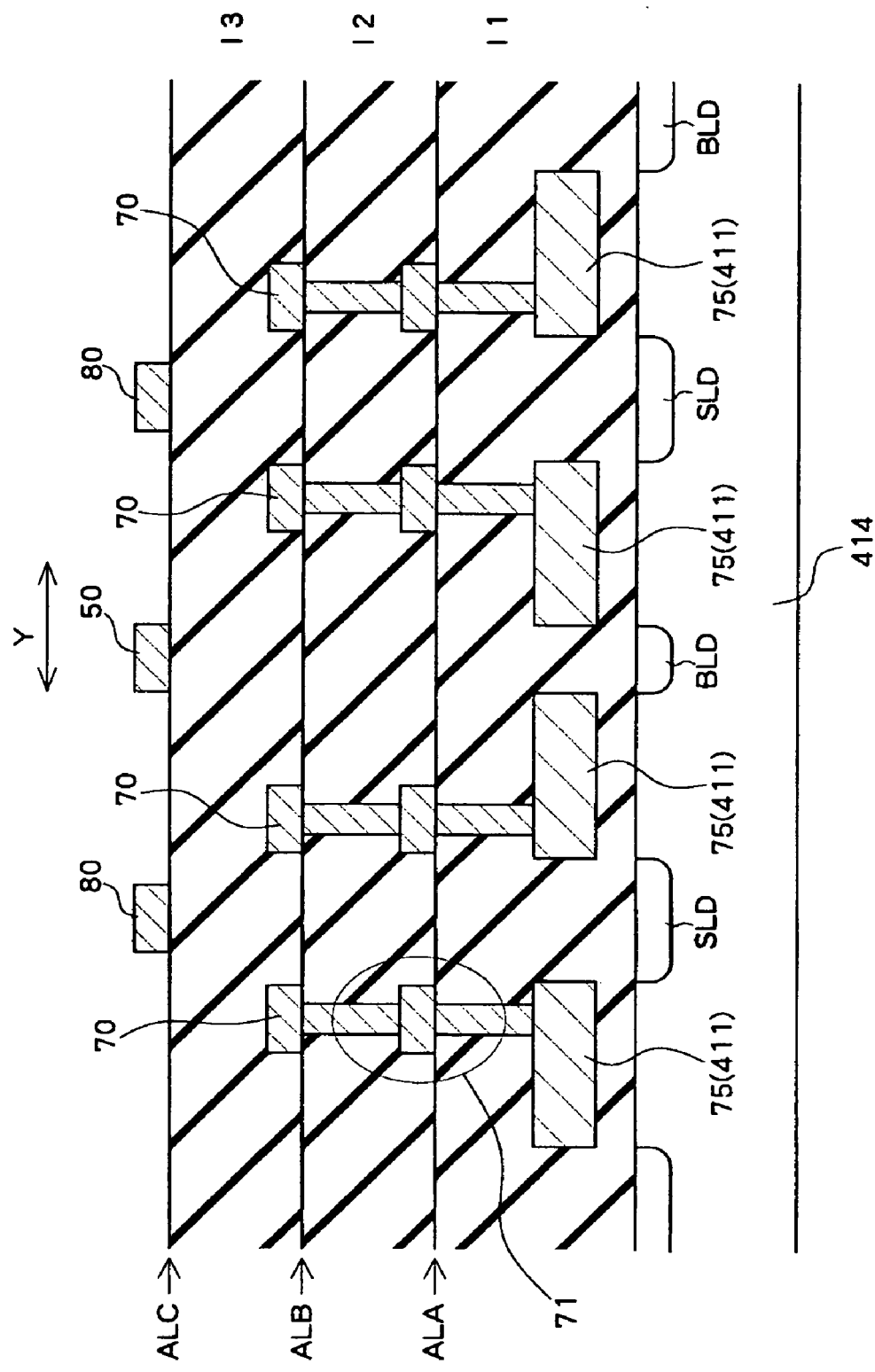
FIG. 4 is a cross-sectional view showing the structure taken along line 4—4 shown in FIG. 3.

The cross-section taken along line 4—4 is described below with reference to FIG. 4. A numeral 414 indicates the substrate. A symbol I1 indicates a first insulating layer, a symbol I2 indicates a second insulating layer, and a symbol I3 indicates a third insulating layer. The select gate connection sections 75 (select gates 411) are covered with the first insulating layer I1. The select gate connection section 75 (select gate 411) is formed of a conductor (polysilicon, for example). The source line diffusion layers SLD and the bitline diffusion layers BLD are formed in the substrate 414. The bitline diffusion layer BLD is shared by two memory cells 410 disposed on either side of the bitline diffusion layer BLD in the column direction Y. The source line diffusion layer SLD is shared by two memory cells 410 disposed on either side of the source line diffusion layer SLD in the column direction Y.

The select lines 70 are formed as the second interconnect layer ALB. The select line 70 is formed of a conductor (metal, for example). The select line 70 is connected with the select gate connection section 75 (select gate 411) formed in the lower layer through the select line connection section 71. The source lines 80 and the wordlines 50 are formed as the third interconnect layer ALC. The wordline 50 and the source line 80 are formed of a conductor (metal, for example). In the drawings, sections indicated by the same symbols have the same meanings.

Figure 5:
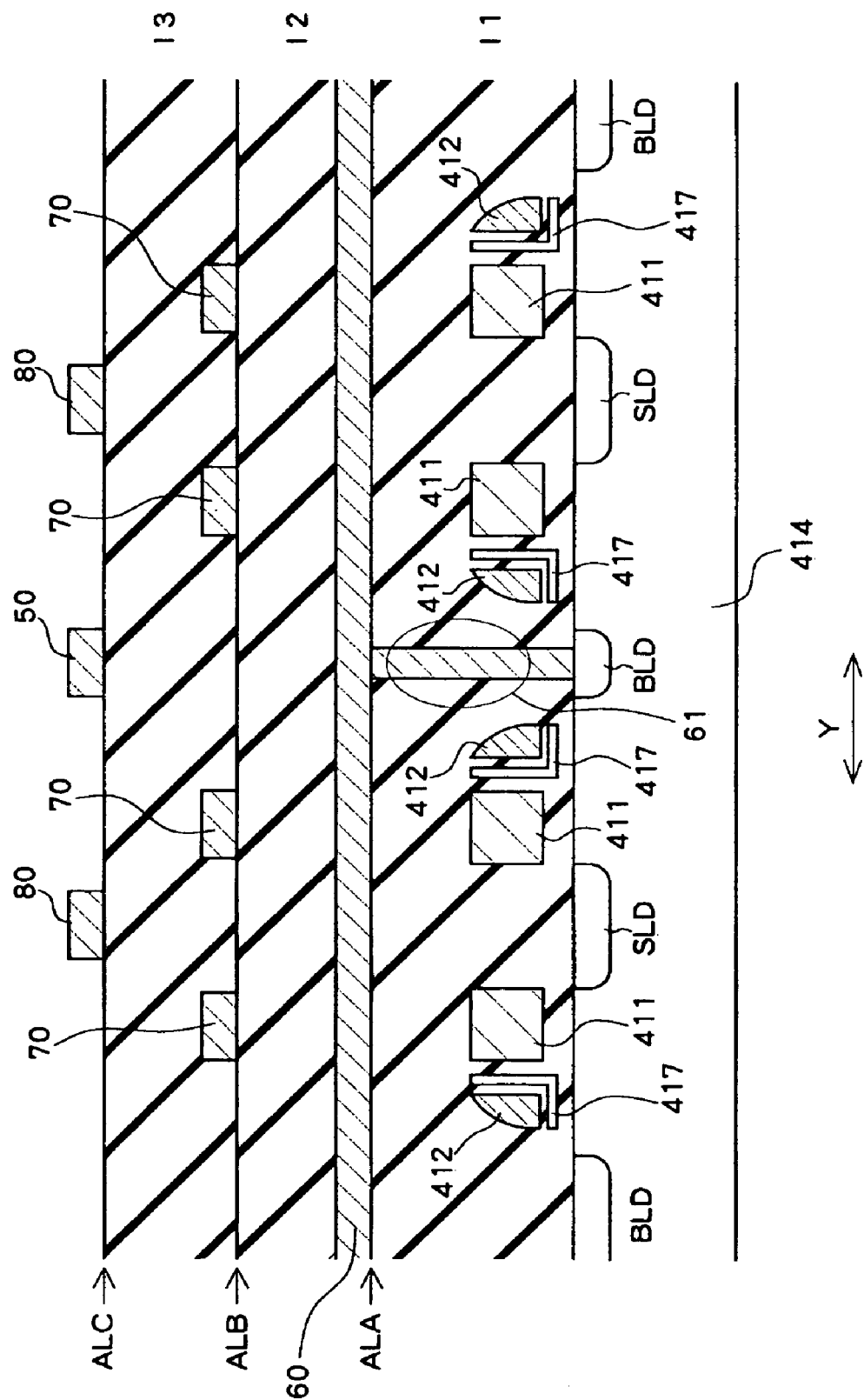
FIG. 5 is a cross-sectional view showing the structure taken along line 5—5 shown in FIG. 3.

The cross-section taken along line 5—5 is described below with reference to FIG. 5. The select gates 411 and the word gates 412 are covered with the first insulating layer I1 on the substrate 414. A nitride film 417 (SiN, for example)

is formed between the word gate 412 and the substrate 414. The nitride film 417 (SiN, for example) may be formed in the shape of the letter "L" (or inverted L shape), as shown in FIG. 5. The select gate 411 and the word gate 412 are formed of a conductor (polysilicon, for example). One bitline 60 is formed as the first interconnect layer ALA. The bitline 60 may be formed of a conductor (metal, for example). Each of the bitlines 60 is connected with the bitline diffusion layers BLD in the substrate 414 through the bitline connection sections 61 (connection section which connects the bitline 60 with the substrate 414). The select lines 70 are formed as the second interconnect layer ALB. The wordlines 50 and the source lines 80 are formed as the third interconnect layer ALC.

Figure 6:
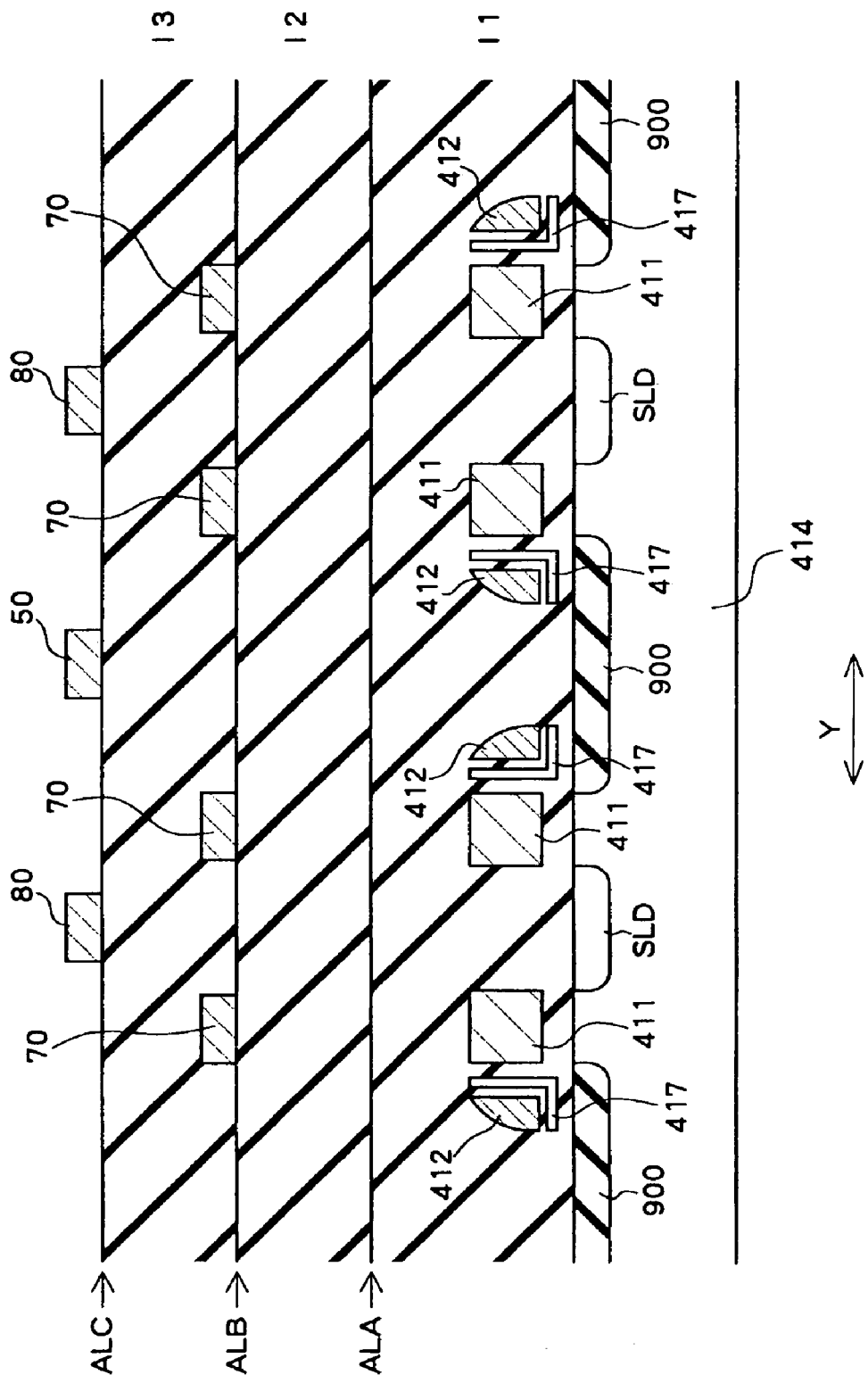
FIG. 6 is a cross-sectional view showing the structure taken along line 6—6 shown in FIG. 3.

The cross-section taken along line 6—6 is described below with reference to FIG. 6. The element isolation regions 900 and the source line diffusion layers SLD are formed in the substrate 414. Since the element isolation region 900 is formed of an insulator, a channel region is not formed between the element isolation region 900 and the source line diffusion layers SLD in the substrate 414. The select gates 411, the word gates 412, and the nitride films 417 are covered with the first insulating layer I1 in the same manner as in FIG. 5. The select lines 70 are formed as the second interconnect layer ALB. The wordlines 50 and the source lines 80 are formed as the third interconnect layer ALC.

Figure 7:
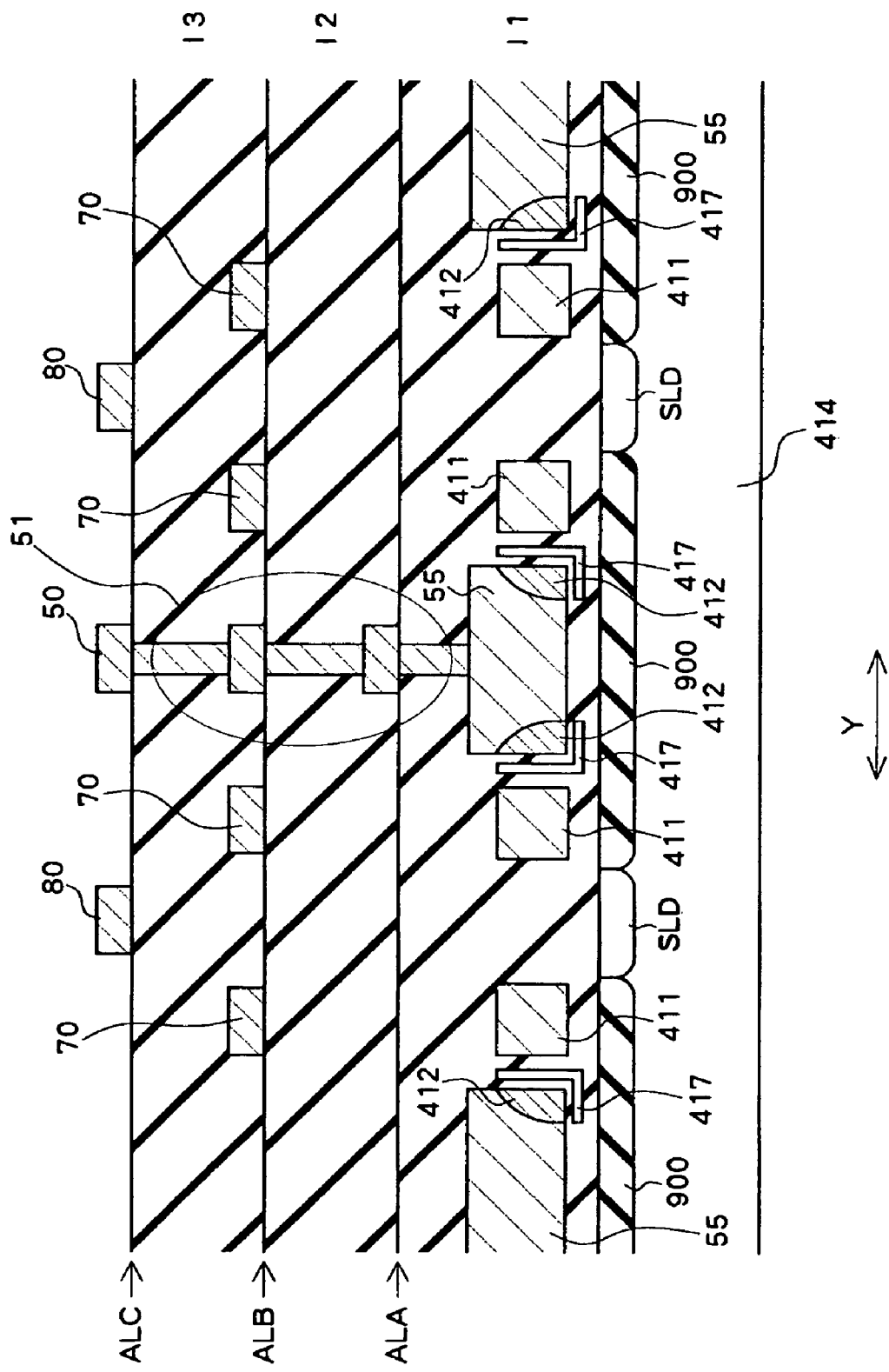
FIG. 7 is a cross-sectional view showing the structure taken along line 7—7 shown in FIG. 3.

The cross-section taken along line 7—7 is described below with reference to FIG. 7. The word gate connection section 55 is formed to connect adjacent two word gates 412. The word gate connection section 55 is formed of a conductor (polysilicon, for example). The element isolation region 900 is formed in the substrate 414 under the word gate connection section 55 and two select gates 411 formed on either side of the word gate connection section 55. The word gate interconnection 51 is connected with the word gate connection section 55. The word gate interconnection 51 is formed of a conductor (metal, for example). The wordlines 50 and the source lines 80 are formed as the third interconnect layer ALC. The wordline 50 is connected with the word gate connection section 55 covered with the first insulating layer I1 through the word gate interconnection 51.

Figure 8:
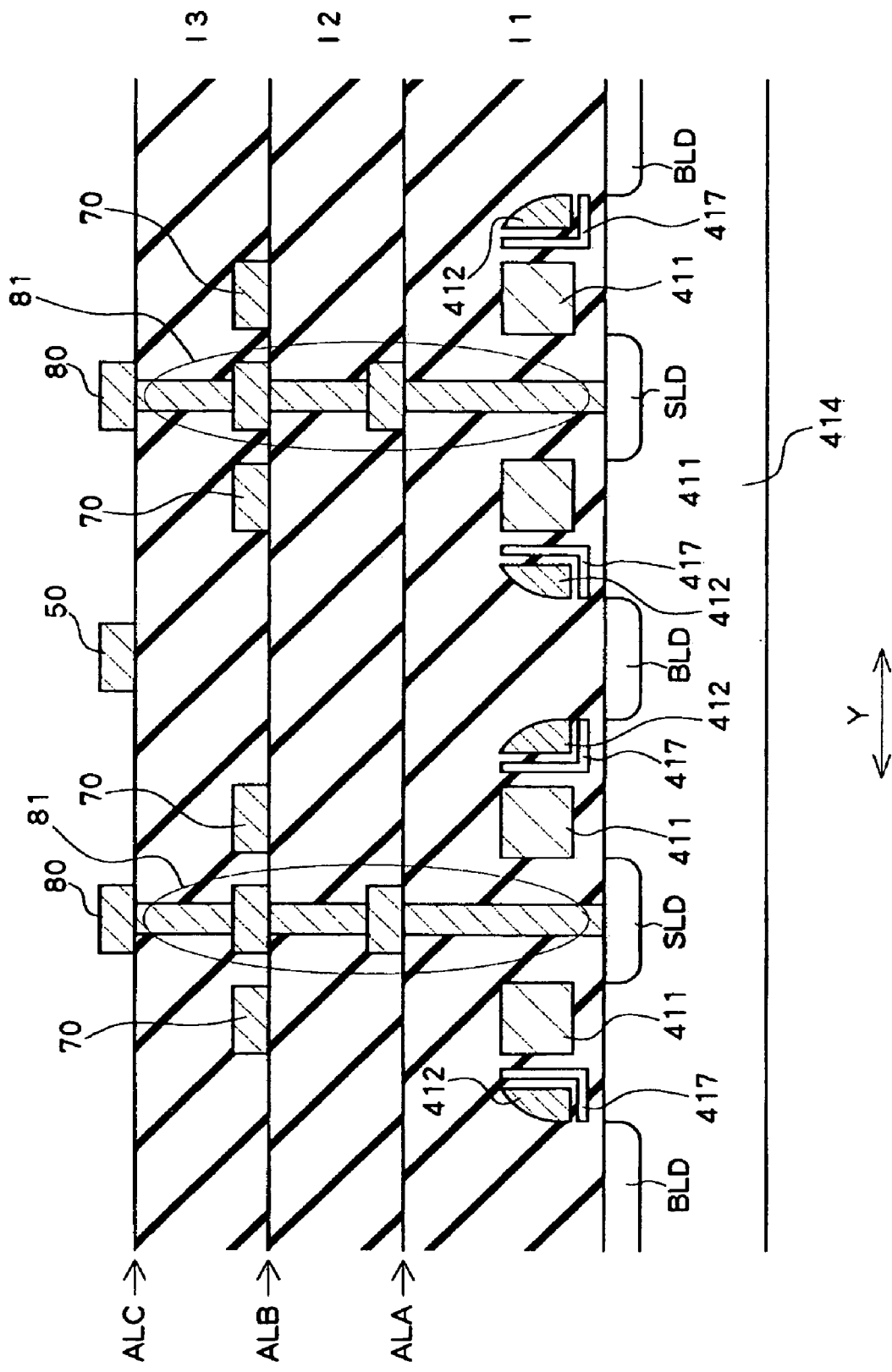
FIG. 8 is a cross-sectional view showing the structure taken along line 8—8 shown in FIG. 3.

The cross-section taken along line 8—8 is described below with reference to FIG. 8. The wordlines 50 and the source lines 80 are formed as the third interconnect layer ALC. Each of the source lines 80 is connected with the source line diffusion layers SLD in the substrate 414 through the source line connection sections 81 (connection section which connects the source line 80 with the substrate 414). The source line connection section 81 is formed of a conductor (metal, for example).

The above-described configuration of the memory cell 410 is an example. For example, the nitride film 417 of the memory cell 410 need not be formed to extend between the select gate 411 and the word gate 412. A silicide (not shown) may be formed on the surface of the word gate 412. A Co silicide or Ti silicide may be used as the silicide (not shown), for example. This reduces the load resistance of the word gate 412.

2. Description of Operation

In the present embodiment, the memory cell 410 is accessed in units of memory blocks 400. Specifically, the memory cell 410 is selected by selecting one memory block 400 and selecting one memory cell 410. The memory cell 410 selected is called a selected memory cell. The memory block 400 including the selected memory cell is called a selected memory block, and the memory blocks 400 other than the selected memory block are called unselected memory blocks.

The wordline 50 selected from among the plurality of wordlines 50 is called a selected wordline, and the wordlines 50 other than the selected wordline are called unselected wordlines. The bitline 60 selected from among the plurality of bitlines 60 is called a selected bitline, and the bitlines 60 other than the selected bitline are called unselected bitlines. The select line 70 selected from among the plurality of select lines 70 is called a selected select line, and the select lines 70 other than the selected select line are called unselected select lines. The source line 80 selected from among the plurality of source lines 80 is called a selected source line, and the source lines 80 other than the selected source line are called unselected source lines.

The wordlines 50, the bitlines 60, the select lines 70, and the source lines 80 in the unselected memory block are set at an unselected memory block voltage (0 V) in all operations. Each operation (standby, read, program, and erase) is described below with reference to FIG. 9. The area encircled by a dotted line and indicated by a symbol SM in FIG. 9 indicates a selected memory cell. A symbol USM and symbols A to D indicate unselected memory cells.

2.1. Standby

All the wordlines 50 are set at a standby word voltage (0 V). All the bitlines 60 are set at a standby bit voltage (0 V). All the select lines 70 are set at a standby select voltage (0 V). All the source lines 80 are set at a standby source voltage (0 V).

All the memory cells 410 in the memory cell array 4000 (in the selected memory block and the unselected memory blocks) are set at the above-described voltage application state during standby.

2.2 Read

Figure 9:
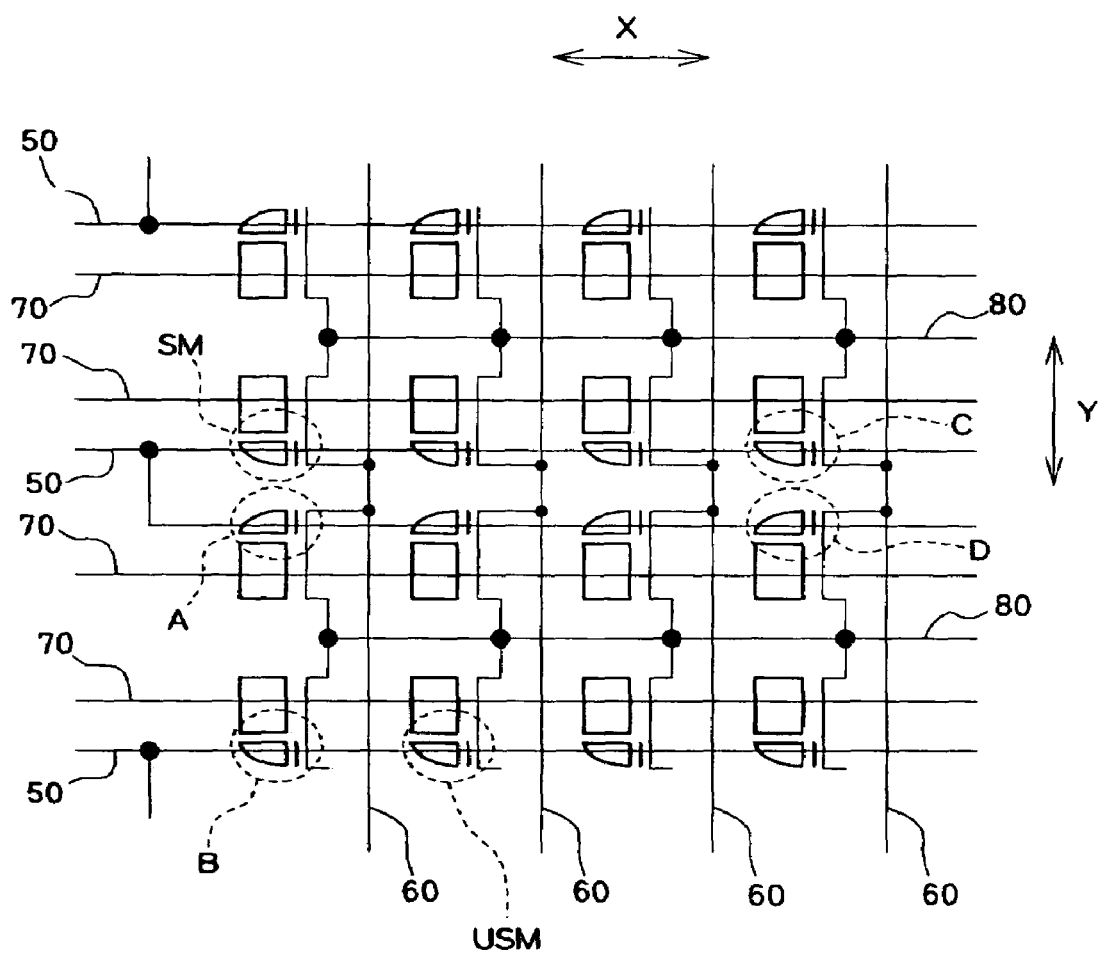
FIG. 9 is a circuit diagram showing a part of a memory block according to an embodiment of the present invention.

The wordline 50 connected with the selected memory cell SM shown in FIG. 9 (selected wordline) is charged to a read selected word voltage (power supply voltage Vcc). All the unselected wordlines in the selected memory block are set at a read unselected word voltage (0 V). The select line 70 connected with the selected memory cell SM (selected select line) is charged to a read selected select voltage (power supply voltage Vcc). All the unselected select lines in the selected memory block are set at a read unselected select voltage (0 V). All source lines 80 including the source line 80 connected with the selected memory cell SM are set at a read selected source voltage (0 V). The bitline 50 connected with the selected memory cell (selected bitline (including the bitline 50 connected with the selected memory cell SM)) is set at a read selected bit voltage (Vsa, 1 V, for example). Other bitlines 60, that is, all the unselected bitlines in the selected memory block are set at a read unselected bit voltage (0 V). A read substrate voltage (0 V) is applied to the substrate 414 in the selected memory block.

The above-described voltage application state causes a channel to be formed in the channel region between the source line diffusion layer SLD and the bitline diffusion layer BLD on either side of the selected memory cell. Since the word gate 412 of the selected memory cell SM is charged to the read selected word voltage (Vcc), electrons injected into the channel region become hot electrons. Since the select gate 411 of the selected memory cell SM is charged to the read selected select voltage (Vcc), the hot electrons are drawn toward the select gate 411. This allows a current (IDS) to flow through the channel region between the source line diffusion layer SLD and the bitline diffusion layer BLD on either side of the selected memory cell SM.

Figure 10:
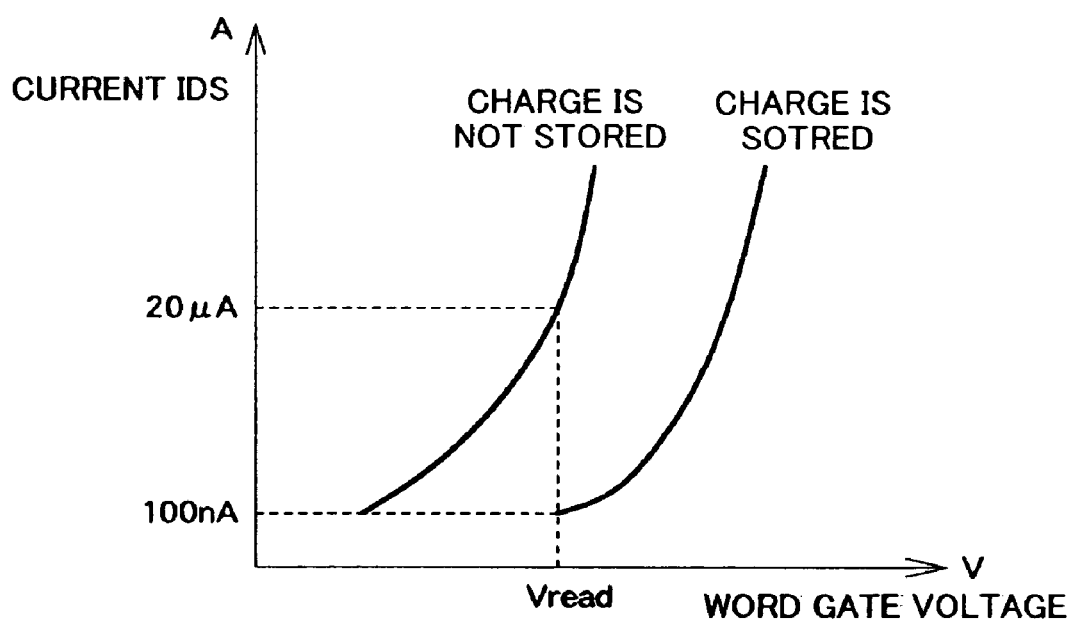
FIG. 10 shows the relationship between the presence or absence of a charge in an ONO film and a flowing current.

The three-region structure consisting of the word gate 412, the ONO film 413, and the channel region of the memory cell 410 may be considered as a MOS transistor. In this case, the threshold value of the transistor becomes higher in a state in which a charge is trapped in the ONO film 413 than in a state in which a charge is not trapped in the ONO film 413. FIG. 10 shows the correlation between the presence or absence of a charge and a current which flows between the source line diffusion layer SLD and the bitline diffusion layer BLD.

In FIG. 10, in the case where a voltage Vread is applied to the word gate 412, about 20 μA of current IDS flows when a charge is not trapped in the ONO film, and the current IDS flows only to a small extent when a charge is trapped in the ONO film. Specifically, since the threshold value of the transistor increases when a charge is trapped in the ONO film, the current IDS flows only to a small extent if the voltage applied to the word gate 412 is the voltage Vread.

The data retained in the selected memory cell can be read by reading the amount of current using a sense amplifier (not shown) disposed for each bitline 60.

This is the principle of reading data from the selected memory cell. The above-described read operation is a forward read. Specifically, a higher voltage is applied to the source line diffusion layer SLD than to the bitline diffusion layer BLD in the same manner as in the program operation. A reverse read can also be used as the read method. In this case, the voltages applied to the source line diffusion layer SLD and the bitline diffusion layer BLD in the present embodiment are each replaced by the other.

Table 1 shows the voltage application state during reading (forward read and reverse read). The unselected memory cell in Table 1 indicates the unselected memory cell USM shown in FIG. 9, and the selected memory cell in Table 1 indicates the selected memory cell SM shown in FIG. 9. A numerical value or Vcc in the cell in Table 1 indicates a voltage value. A symbol WL indicates the wordline 50, and a symbol SG indicates the select line 70. A symbol SL indicates the source line 80, and a symbol BL indicates the bitline 60. In the following description, sections indicated by the same symbols as in Table 1 have the same meanings as in Table 1.

TABLE 1

| | | Selected memory block | | |
|---|---|---|---|---|
| | | Unselected memory cell | Selected memory cell | Unselected memory block |
| Forward read | WL | 0 V | Vcc | 0 V |
| | SG | 0 V | Vcc | 0 V |
| | SL | | 0 V | 0 V |
| | BL | 0 V | Vsa | 0 V |
| Reverse read | WL | 0 V | Vcc | 0 V |
| | SG | 0 V | Vcc | 0 V |
| | SL | | Vcc | 0 V |
| | BL | 0 V | Vcc − Vsa | 0 V |

The unselected block in Table 1 is in the same state as the standby state. The unselected block is in the same state as the standby state during programming and erasing.

The unselected memory cells can be classified into five types including the unselected memory cell USM corresponding to the voltage application state. The remaining four types are the unselected memory cells A to D. The selected wordline, the selected bitline, the unselected select line, and the selected source line are connected with the unselected memory cell A shown in FIG. 9. The unselected wordline, the selected bitline, the unselected select line, and the selected source line are connected with the unselected memory cell B shown in FIG. 9. The selected wordline, the unselected bitline, the selected select line, and the selected source line are connected with the unselected memory cell C shown in FIG. 9. The selected wordline, the unselected bitline, the unselected select line, and the selected source line are connected with the unselected memory cell D shown in FIG. 9. Table 2 shows the voltage application state of the unselected memory cells A to D.

TABLE 2

| | | Unselected memory cell A | Unselected memory cell B | Unselected memory cell C | Unselected memory cell D |
|---|---|---|---|---|---|
| Forward read | WL | Vcc | 0 V | Vcc | Vcc |
| | SG | 0 V | 0 V | Vcc | 0 V |
| | SL | 0 V | 0 V | 0 V | 0 V |
| | BL | Vsa | Vsa | 0 V | 0 V |
| Reverse read | WL | Vcc | 0 V | Vcc | Vcc |
| | SG | 0 V | 0 V | Vcc | 0 V |
| | SL | Vcc | Vcc | Vcc | Vcc |
| | BL | Vcc − Vsa | Vcc − Vsa | Vcc | Vcc |

In view of the above-described principle, the selected wordline, the selected bitline, the selected select line, and the selected source line must be connected with the selected memory cell. If at least one of the unselected lines (unselected wordline, unselected bitline, unselected select line, and unselected source line) is connected with the memory cell 410, this memory cell 410 is an unselected memory cell.

2.3 Program

The wordline 50 connected with the selected memory cell SM (selected wordline) is charged to a program selected word voltage (5.5 V). All the unselected wordlines in the selected memory block are set at a program unselected word voltage (0 V). The select line 70 connected with the selected memory cell SM (selected select line) is charged to a program selected select voltage (1 V), and all the unselected select lines are set at a program unselected select voltage (0 V). The source line 80 connected with the selected memory cell SM (selected source line) is charged to a program selected source voltage (0 V), and all the unselected source lines are set at a program unselected source voltage (0 V). The bitline 60 connected with the selected memory cell SM (selected bitline) is charged to a program selected bit voltage (5 V), and all the unselected bitlines in the selected memory block are set at a program unselected bit voltage (0 V). A program substrate voltage (0 V) is applied to the substrate 414 in the selected memory block.

The above-described voltage application state causes a channel to be formed in the channel region between the source line diffusion layer SLD and the bitline diffusion layer BLD on either side of the selected memory cell. Since the select gate 411 of the selected memory cell SM is charged to the program selected select voltage (1 V), electrons injected into the channel region become hot electrons. Since the word gate 412 of the selected memory cell is charged to the program selected word voltage (5.5 V), the hot electrons are drawn toward the word gate 412. The hot electrons drawn toward the word gate 412 are trapped in the ONO film 413. This is the principle of writing (programming) data into the selected memory cell.

Table 3 shows the voltage application state during programming.

TABLE 3

| | | Selected memory block | | |
| --- | --- | --- | --- | --- |
| | | Unselected memory cell | Selected memory cell | Unselected memory block |
| Program | WL | 0 V | 5.5 V | 0 V |
| | SG | 0 V | 1 V | 0 V |
| | SL | 0 V | 0 V | 0 V |
| | BL | 0 V | 5 V | 0 V |

The unselected memory cell in Table 3 indicates the unselected memory cell USM shown in FIG. 9. The selected memory cell in Table 3 indicates the selected memory cell SM shown in FIG. 9.

There are five types of voltage application states for the unselected memory cells (unselected memory cell USM and unselected memory cells A to D) in the program operation in the same manner as in the read operation (see FIG. 9). Table 4 shows the voltage application states of the unselected memory cells A to D.

TABLE 4

| | | Unselected memory cell A | Unselected memory cell B | Unselected memory cell C | Unselected memory cell D |
| --- | --- | --- | --- | --- | --- |
| Program | WL | 5.5 V | 0 V | 5.5 V | 5.5 V |
| | SG | 0 V | 0 V | 1 V | 0 V |
| | SL | 0 V | 0 V | 0 V | 0 V |
| | BL | 5 V | 5 V | 0 V | 0 V |

2.4 Erase

The erase operation is performed for all the memory cells 410 in the selected memory block. Specifically, all the memory cells 410 in the selected memory block are selected memory cells. All the wordlines 50 in the selected memory block are charged to an erase word voltage (−3 V). All the select lines 70 in the selected memory block are set at an erase select voltage (0 V). All the source lines 80 in the selected memory block are charged to an erase source voltage (5 V). All the bitlines 60 in the selected memory block are set at an erase bit voltage (0 V). An erase substrate voltage (0 V) is applied to the substrate 414 in the selected memory block.

The above-described voltage application state causes a channel to be formed in the channel region between the source line diffusion layer SLD and the bitline diffusion layer BLD. However, since the word gate 412 of the memory cell 410 in the selected block is charged to the erase word voltage (−3 V), an electric field is generated between the word gate 412 and the bitline diffusion layer BLD. The charge (electrons) which has been trapped in the ONO film 413 can be erased by hot holes generated by the application of the electric field.

Table 5 shows the voltage application state during erasing (erase by hot holes).

TABLE 5

| | | Selected memory block Selected memory cell | Unselected memory block |
| --- | --- | --- | --- |
| Erase | WL | −3 V | 0 V |
| | SG | 0 V | 0 V |
| | SL | 5 V | 0 V |
| | BL | 0 V | 0 V |

In the present embodiment, data is erased by the hot holes. However, data may be erased by using a Fowler-Nordheim (FN) erase method. In this method, all the wordlines 50 in the selected memory block are charged to an FN erase word voltage (−8 V). All the select lines 70 in the selected memory block are set at an FN erase select voltage (0 V). All the source lines 80 in the selected memory block are set at a floating state or at an FN erase source voltage (5 V). All the bitlines 60 in the selected memory block are set at an erase bit voltage (5 V). An FN erase substrate voltage (5 V) is applied to the substrate 414 in the selected memory block. The FN erase method uses FN tunneling. The principle of this method is that the charge (electrons) trapped in the ONO film 413 is released to outside of the ONO film 413 by a tunnel effect by applying a given electric field (voltage difference of 15 V, for example) to the ONO film 413.

The unselected memory block during the erase operation (erase by hot holes and FN erase) is in the same voltage application state as the standby state.

Table 6 shows the voltage application state during erasing (FN erase).

TABLE 6

| | | Selected memory block Selected memory cell | Unselected memory block |
| --- | --- | --- | --- |
| Erase | WL | −8 V | 0 V |
| | SG | 0 V | 0 V |
| | SL | 5 V | 0 V |
| | BL | 5 V | 0 V |
| | Pwell | 5 V | 0 V |

3. Comparison with Comparative Example and Effect

Figure 11:
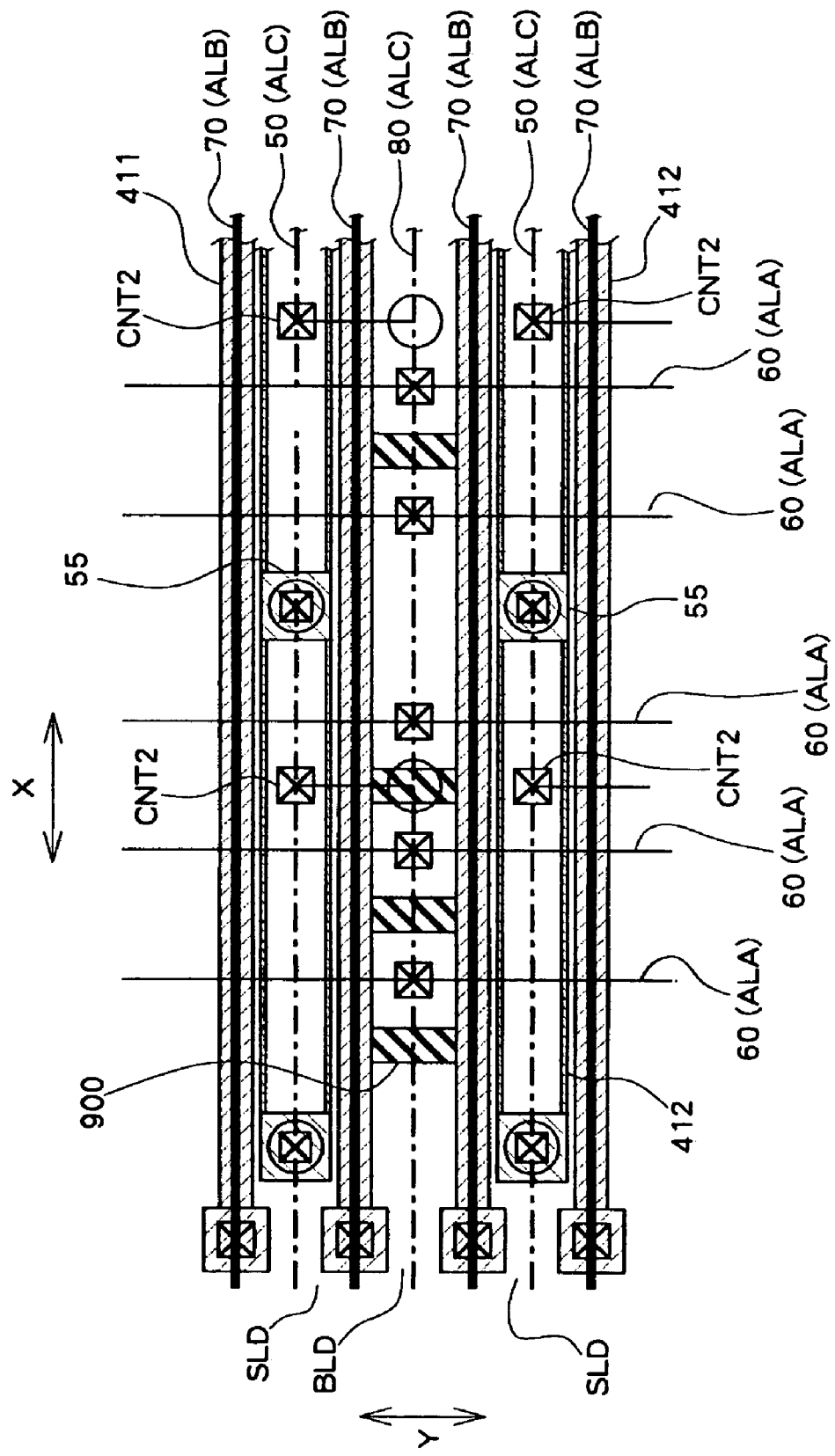
FIG. 11 is a plan view showing the structure of a memory block in a first comparative example according to an embodiment of the present invention.

FIG. 11 is a plan view of a first comparative example. In the first comparative example, the word gate connection sections 55 are formed on the source line diffusion layer SLD in order to increase the access speed. In order to prevent occurrence of a short circuit between the source line diffusion layer SLD and the word gate 412, the element isolation region 900 is formed in the substrate 414 under the location at which the word gate connection section 55 is formed. A plurality of interconnect connection sections (contacts) CNT2 are formed on the source line diffusion layer SLD in order to dispose the element isolation regions 900. The layout area increases as a greater number of interconnect connection sections (contact) CNT2 are formed.

In the present embodiment shown in FIG. 3, since the word gate connection section 55 is formed on the bitline diffusion layer BLD, the source line diffusion layer SLD is continuously formed along the row direction X without being separated. Therefore, since the number of interconnect connection sections (contacts) CNT2 can be significantly reduced, the layout area can be reduced.

Figure 12:
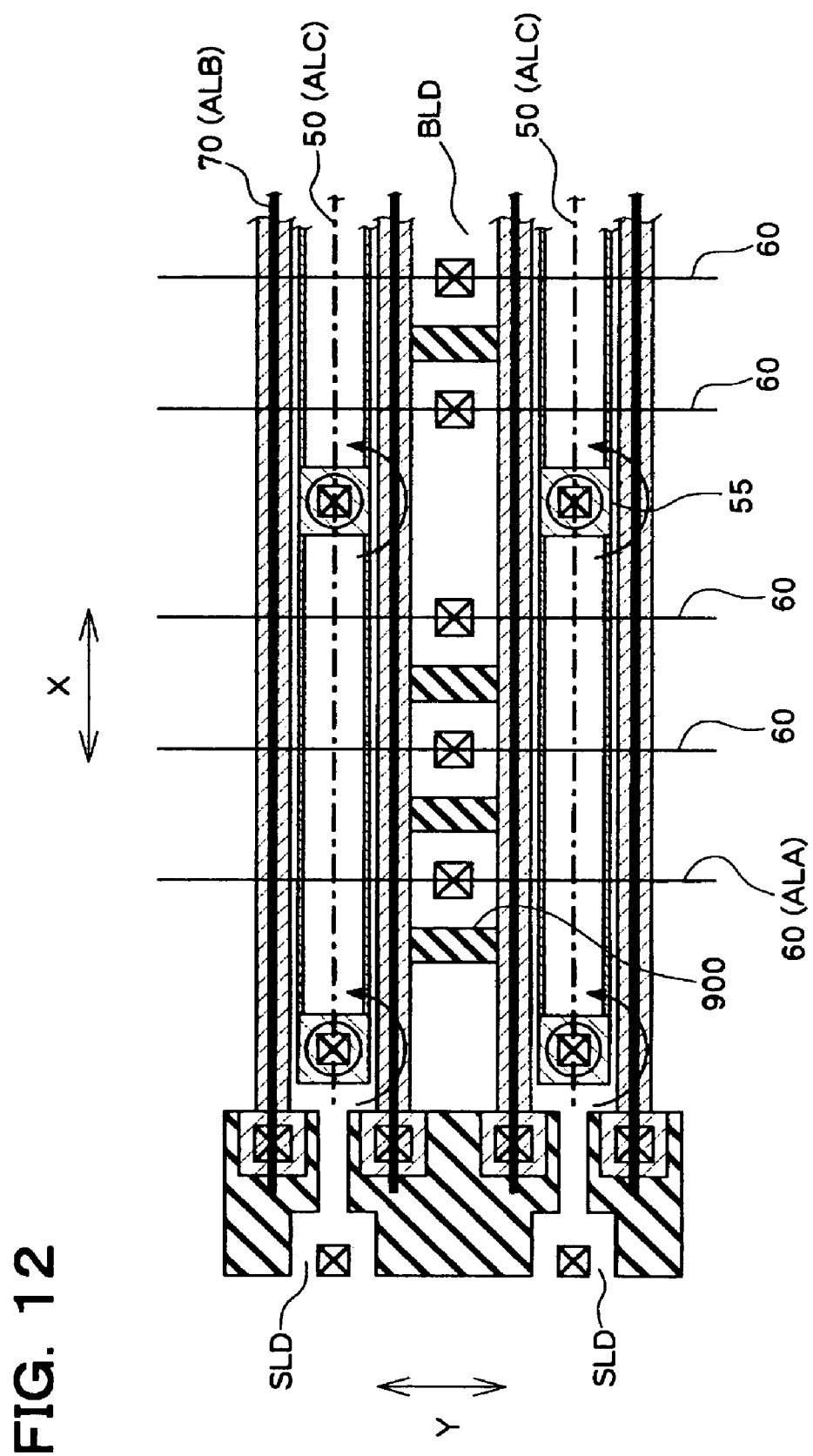
FIG. 12 is a plan view showing the structure of a memory block in a second comparative example according to an embodiment of the present invention.
Figure 13:
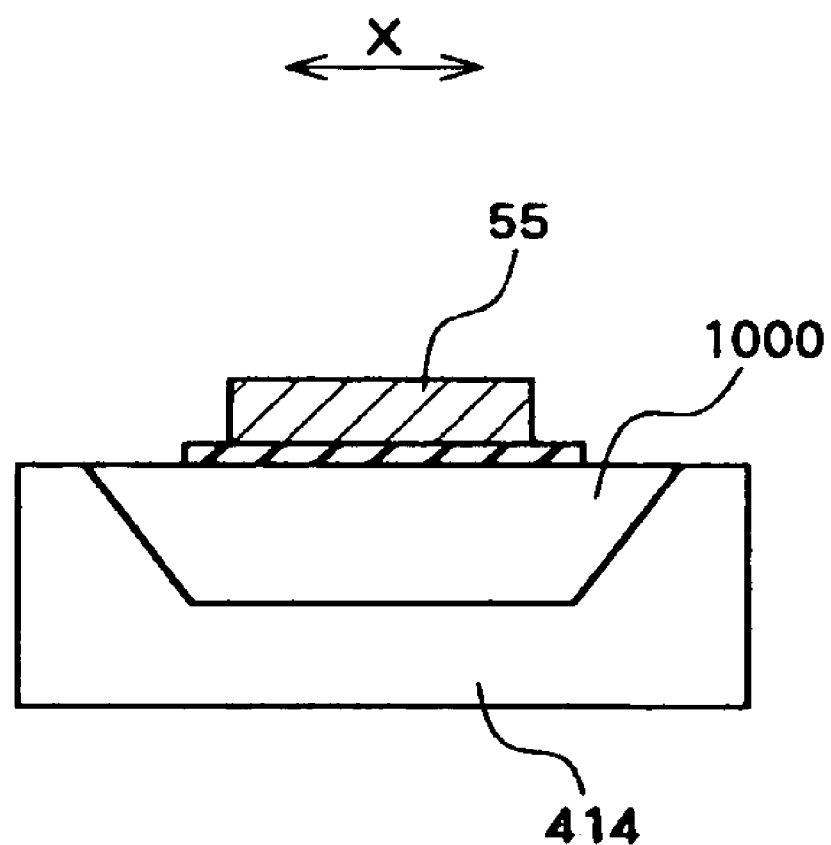
FIG. 13 is a cross-sectional view showing a structure of a crossunder layer in the second comparative example according to an embodiment of the present invention.

FIG. 12 is a plan view of a second comparative example. In the second comparative example, a crossunder layer (diffusion layer) 1000 (see FIG. 13) is formed instead of the element isolation region 900 in the first comparative example. The number of interconnect connection sections (contacts) CNT2 (see FIG. 11) for the source line diffusion layer SLD is reduced by forming the crossunder layer 1000 at the formation position of the word gate connection section 55. However, the number of masks and the number of process steps are increased by forming the crossunder layer 1000, whereby the manufacturing steps become complicated. Moreover, since the crossunder layer 1000 has high resistance, a voltage drop of the source line diffusion layer SLD occurs.

In the present embodiment, since the source line diffusion layer SLD can be continuously formed along the row direction X without using the crossunder layer 1000, the above-described drawback characteristic of the crossunder layer 1000 can be prevented. Specifically, the present embodiment can reduce the layout area of the semiconductor memory device without causing the manufacturing steps to become complicated.

The present invention can provide a nonvolatile semiconductor memory device having a small layout area as described above.

The present invention is not limited to the above-described embodiments. Various modifications and variations are possible without departing from the spirit and scope of the present invention.

What is claimed is:

1. A nonvolatile semiconductor memory device comprising:
    a memory cell array in which a plurality of memory cells are arranged in a row direction and a column direction, wherein the memory cell array includes:
    a plurality of source line diffusion layers, each of the source line diffusion layers extending along the row direction and connecting in common with the memory cells arranged in the row direction,
    a plurality of bitline diffusion layers,
    a plurality of element isolation regions which separate each of the bitline diffusion layers, and
    a plurality of word gate common connection sections,
    wherein each of the memory cells includes one of the source line diffusion layers, one of the bitline diffusion layers, a channel region between the one source line diffusion layer and the one bitline diffusion layer, a word gate and a select gate which are disposed to face the channel region, and a nonvolatile memory element formed between the word gate and the channel region,
    wherein two of the word gates are formed between two of the select gates adjacent in the column direction, and one of the bitline diffusion layers is formed between the two word gates,
    wherein each of the word gate common connection sections is connected in common with the two word gates above at least one of the element isolation regions, and
    wherein a plurality of word gate wiring layers are formed above the word gate common connection sections, and each of the word gate wiring layers is connected with at least one word gate interconnection which is connected with one of the word gate common connection sections.

2. The nonvolatile semiconductor memory device as defined in claim 1,
    wherein an insulator is formed under the two word gates, and each of the word gate common connection sections includes a conductor which is connected in common with the two word gates formed on the insulator.

3. The nonvolatile semiconductor memory device as defined in claim 2,
    wherein the insulator is formed by continuously forming the same material as a material for the nonvolatile memory element.

4. The nonvolatile semiconductor memory device as defined in claim 1,
    wherein the word gate common connection sections are formed along the column direction.

5. The nonvolatile semiconductor memory device as defined in claim 1, further comprising:
    a bitline connection section which is provided between one of the word gate common connection sections and one of the element isolation regions adjacent to the one word gate common connection section in the row direction, and connects one of the bitline diffusion layers with one of a plurality of bitlines.

* * * * *